United States Patent [19]
Bhan et al.

[11] Patent Number: 5,252,511
[45] Date of Patent: Oct. 12, 1993

[54] ISOLATION METHOD IN A SEMICONDUCTOR DEVICE

[75] Inventors: Cheon-su Bhan, Seoul; Yun-gi Kim, Kangweon; Byeong-yeol Kim, Kyunggi, all of Rep. of Korea

[73] Assignee: Samsung Electronics Co., Ltd., Kyunggi, Rep. of Korea

[21] Appl. No.: 822,139

[22] Filed: Jan. 17, 1992

[30] Foreign Application Priority Data

Mar. 4, 1991 [KR] Rep. of Korea ............... 91-3482

[51] Int. Cl.[5] .................................... H01L 21/76
[52] U.S. Cl. ........................... 437/70; 437/72; 437/968
[58] Field of Search ............ 437/69, 70, 72, 940, 437/968; 148/DIG. 117, DIG. 85, DIG. 86

[56] References Cited

FOREIGN PATENT DOCUMENTS 61-100944 5/1986 Japan ........................... 437/69
2-97038 4/1990 Japan ........................... 437/69

Primary Examiner—G. Fourson
Attorney, Agent, or Firm—Cushman, Darby & Cushman

[57] ABSTRACT

An isolation method in a semiconductor device which includes the steps of growing a pad oxide layer on a semiconductor substrate, depositing a polysilicon layer and a first silicon nitride layer on the pad oxide layer, removing and patterning the first silicon nitride layer to define an active region and a field region, depositing a second silicon nitride layer and a thick oxide layer, forming oxide spacers and nitride spacers, ion-implanting impurities, removing the oxide spacers, growing a field oxide layer, and sequentially removing the first silicon nitride layer, the nitride spacers, the polysilicon layer, and the pad oxide layer. This method minimizes the bird's beaks regions and increases the effective isolation distance of the device.

10 Claims, 6 Drawing Sheets

ISOLATION METHOD IN A SEMICONDUCTOR DEVICE

BACKGROUND OF THE INVENTION

The present invention is an isolation method in a semiconductor device, particularly, a method for isolating active regions in a semiconductor device and minimizing the bird's beaks regions.

The trend in recent years is to achieve higher packing densities in semiconductor devices, thus increasing the demand to minimize device isolation regions. Also, as the rule for designing devices is reduced to sub-micron, greatly improved isolation techniques will be required.

In order to reduce bird's beak which occurs in the local oxidation of silicon (LOCOS) method (generally utilized as one of the isolation techniques), sealed interface local oxidation (SILO), poly-buffered LOCOS (PBL), etc., improvements to the LOCUS method have been suggested. However, the suggested improvements lower the breakdown voltage of the device, making it impossible to heavily dope impurities into a channel stop layer, which causes further problems such as punch-through and the like.

Therefore, several methods have been proposed to increase the impurity density of a channel stop layer. One method, framed mask poly-buffered LOCOS (FMPBL) as illustrated in FIGS. 1A through 1F, improves the conventional isolation methods.

Referring to FIG. 1A, pad oxide layer 2 about 150 Å thick is grown on semiconductor substrate 1. Polysilicon layer 3 about 500 Å thick and first silicon nitride layer 4 which is patterned for defining an active region by photolithographic method, are deposited thereon. Then, second silicon nitride layer 5 about 1000 Å thick is deposited on the whole surface of the structure as shown in FIG. 1B.

Referring to FIG. 1C, second silicon nitride layer 5 is anisotropically etched, to form spacers 5a. Then, channel stop layer 6 is formed by ion implanting an impurity, using spacers 5a as a mask. Field oxide layer 7 about 6500 Å thick is grown in a wet ambient at 1000° C. as shown in FIG. 1D.

Referring to FIG. 1E, first silicon nitride layer 4 and polysilicon layer 3 are sequentially removed. The device isolation process is completed through an etch-back process as shown in FIG. 1F.

In this conventional device isolation method, second silicon nitride layer 5 needs to be thick in order to increase the distance between the spacers during their formation. The spacers are provided to prevent the lowering of the junction breakdown voltage and to reduce the punch-through effect. However, a thick second silicon nitride layer causes the first silicon nitride layer to be overetched during the anisotropic etching. This causes impurities to be implanted in the active region during the implantation stage adversely affecting the device. In addition, when the field oxide layer is grown, stress is imposed on field oxide layer 7 at the points where contact is made with the thick second silicon nitride layer 5 for forming the spacer. The stress-affected portion is dented by being etched too much during the etch-back process of field oxide layer 7, so that notches (bird's beaks) are produced in the photolithographic process.

SUMMARY OF THE INVENTION

Therefore, it is an objective of the present invention to provide an isolation method in a semiconductor device which minimizes the bird's beaks regions.

It is another objective of the present invention to provide an isolation method in a semiconductor device which increases the effective isolation distance of the device.

To achieve these and other objects, an isolation method in a semiconductor device is comprised of the steps of growing a pad oxide layer on a semiconductor substrate, and depositing a polysilicon layer and a first silicon nitride layer on said pad oxide layer, patterning said first silicon nitride layer to define an active region and a field region, depositing a thin second silicon nitride layer and a thick oxide layer, forming oxide spacers and nitride spacers, and ion implanting impurities, removing said oxide spacers, and growing a field oxide layer, and sequentially removing said first silicon nitride layer, said nitride spacers, said polysilicon layer, and said pad oxide layer.

An alternative to the above-described isolation method in a semiconductor device according to the present invention is a process where the first silicon nitride layer is removed to be patterned by removing the first silicon nitride layer and a portion of the polysilicon layer. This allows the device isolation layer to be formed more deeply into the substrate, thereby increasing the effective isolation distance which improves device reliability.

BRIEF DESCRIPTION OF THE DRAWINGS

The present invention will now be described with reference to the attached drawings, in which.

DETAILED DESCRIPTION OF THE PREFERRED EMBODIMENTS

Figure 1A:
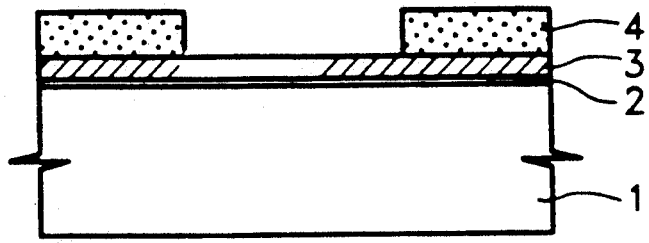
FIGS. 1A through 1F show a process for forming a device isolation region by the conventional FMPBL method.
Figure 1B:
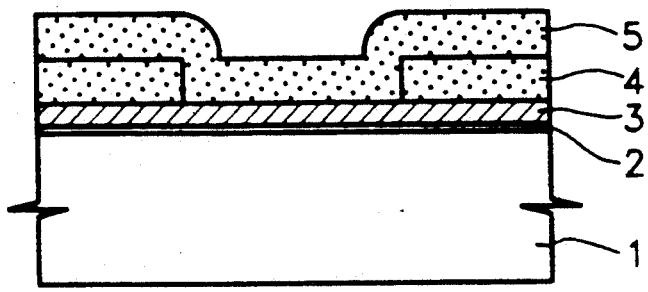
Figure 1C:
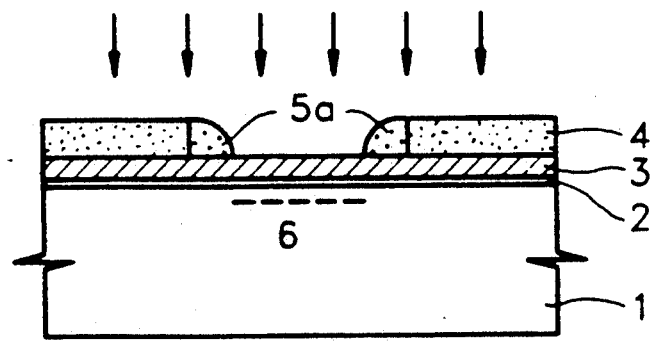
Figure 1D:
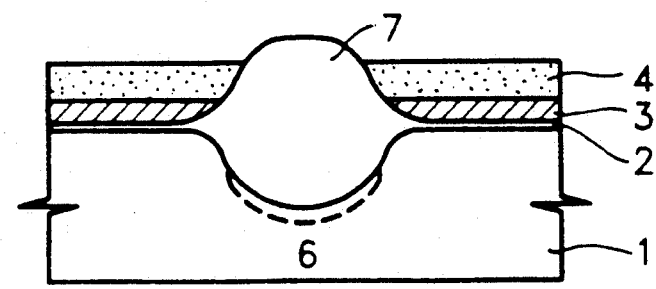
Figure 1E:
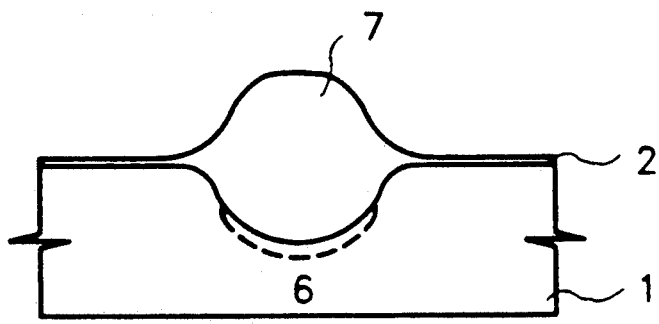
Figure 1F:
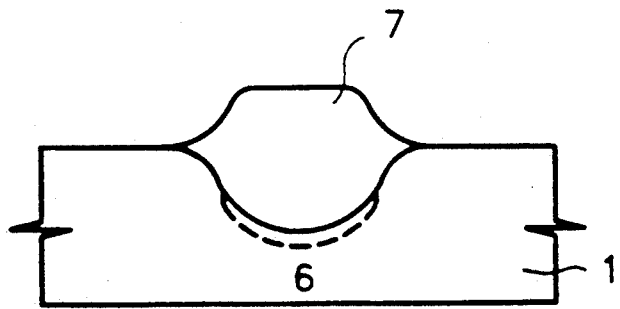
Figure 2A:
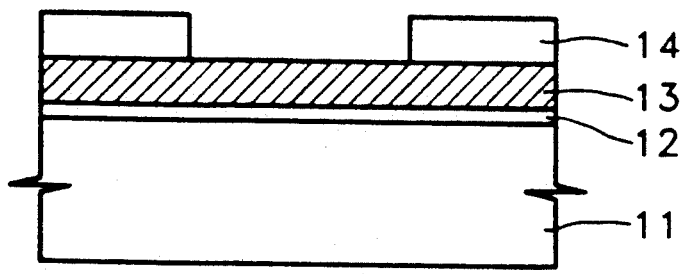
FIGS. 2A through 2E show one embodiment of a process for forming a device isolation region according to the present invention.

Referring to FIG. 2A, pad oxide layer 12 about 200 Å to 500 Å thick is grown on semiconductor substrate 11. Polysilicon layer 13 about 1000 Å to 2000 Å thick, and first silicon nitride layer 14 about 1000 Å to 2000 Å thick are sequentially formed thereon. Then, to define an active region, first silicon nitride layer 14 is patterned by a common photolithographic method.

Figure 2B:
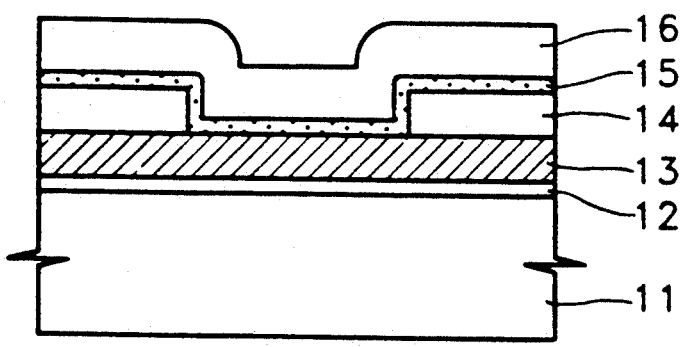

Referring to FIG. 2B, second silicon nitride layer 15 about 300 Å to 500 Å thick, and oxide layer 16 about 1000 Å to 3000 Å thick are formed over the whole surface of the structure.

Figure 2C:
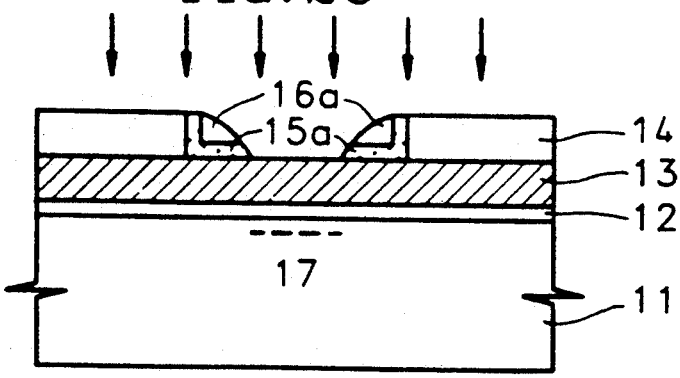

Referring to FIG. 2C, oxide layer 16 and second silicon nitride layer 15 are anisotropically etched to form oxide spacers 16a and nitride spacers 15a. Thereafter impurities are ion implanted to form channel stop region 17 using spacers 15a and 16a as a mask. The advantage here is that the edges of the channel stop layer are masked by oxide spacers 16a during ion implantation.

Figure 2D:
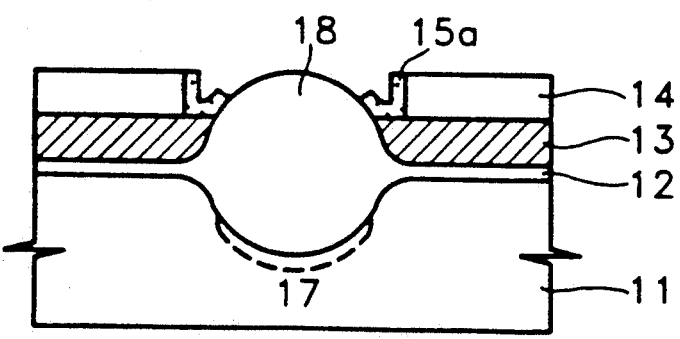

Referring to FIG. 2D, oxide spacers 16a are removed by a wet etching method. Then, field oxide layer 18 is grown by wet oxidation.

While growing field oxide layer 18, L-shaped nitride spacers 15a block lateral diffusion of oxygen which suppresses the extension of the bird's beaks. Moreover, since nitride spacers 15a are thin, stress along the boundaries of field oxide layer 18 is reduced.

Figure 2E:
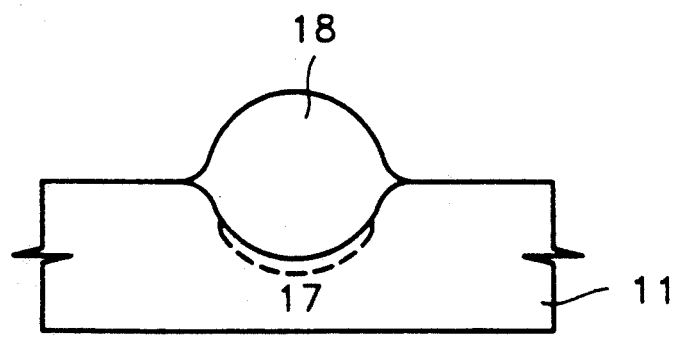

Then, first silicon nitride layer 14, nitride spacers 15a, polysilicon layer 13, and pad oxide layer 12 are sequentially removed, completing the device isolation process, as is illustrated in FIG. 2E.

In the conventional method, a silicon nitride layer for forming spacers is thick, placing greater stress on the portion of a field oxide layer which is in contact with the spacers. This causes the stress affected portion to be overly etched during the etchback process.

In the present invention second silicon nitride layer 15 is thin, thus eliminating stresses affecting field oxide layer 18 and eliminating the formation of the dented portion during the etchback process.

FIGS. 3A through 3E show another embodiment of a process to form a device isolation region according to the present invention.

Figure 3A:
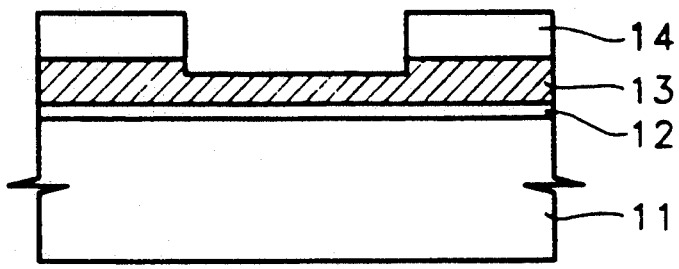
FIGS. 3A through 3E show another embodiment of a process for forming a device isolation region according to the present invention.
Figure 3B:
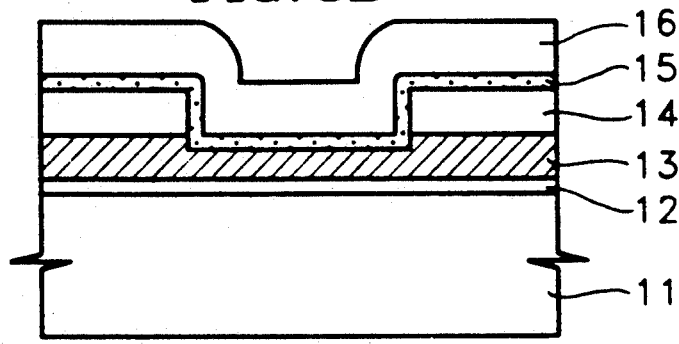
Figure 3C:
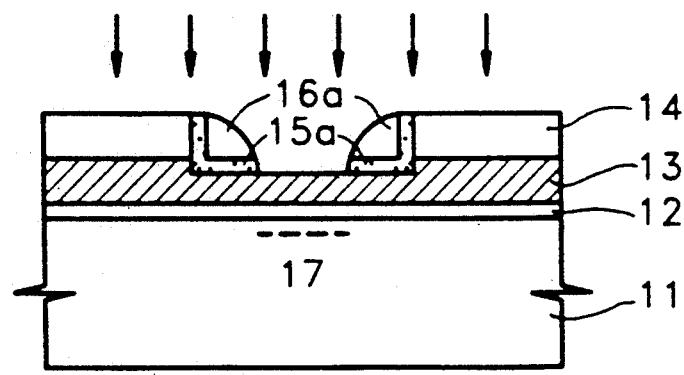
Figure 3D:
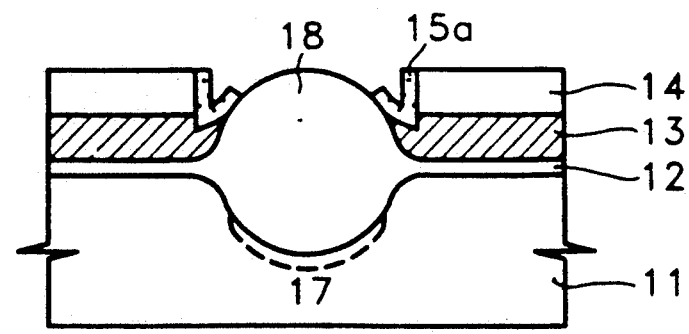
Figure 3E:
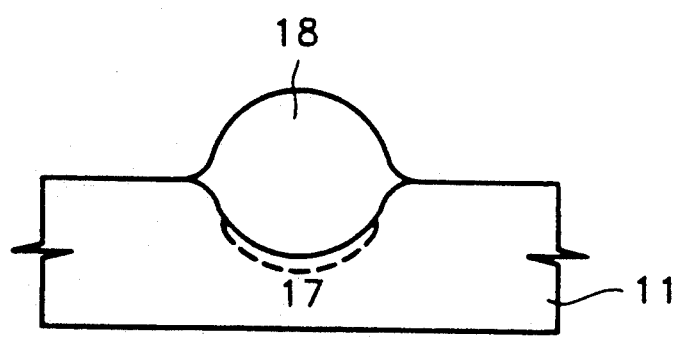

Referring to FIG. 3A, pad oxide layer 12 about 200 Å to 500 Å thick is grown on semiconductor substrate 11. Polysilicon layer 13 about 1000 Å to 2000 Å thick, and first silicon nitride layer 14 about 1000 Å to 2000 Å thick are sequentially formed thereon. Then, to define an active region, first silicon nitride layer 14 and a portion of polysilicon layer 13 are patterned via a common photolithographic method.

The process shown in FIGS. 3B through 3E is identical to that illustrated in FIGS. 2B through 2E.

As described above, a portion of polysilicon layer 13 is also etched which allows field oxide layer 18 to be more deeply buried, increasing the effective isolation distance of the device.

A variation of this embodiment entails growing field oxide layer 18 before removing oxide spacers 16a. After field oxide layer 18 is grown, first silicon nitride layer 14, oxide spacers 16a, nitride spacers 15a, polysilicon layer 13, and pad oxide layer 12 are all sequentially removed.

In the present invention, the thin second silicon nitride layer formed on the field region prevents the oxide layer from being laterally diffused during the process of growing the field oxide layer. This greatly decreases the size of bird's beaks intruding into the active region from the isolation region. As a result, the isolation method according to the present invention is useful in a highly integrated semiconductor memory device, such as a 64 Mbit or higher DRAM.

While this invention has been described in connection with what is presently considered to be the most practical and preferred embodiments, it is to be understood that the invention is not limited to the disclosed embodiment, but, on the contrary, is intended to cover various modifications and equivalent arrangements included within the spirit and scope of the appended claims.

What is claimed is:

1. An isolation method in a semiconductor device comprising the sequentially performed steps of:
   (a) growing a pad oxide layer on a semiconductor substrate, and depositing a polysilicon layer and a first silicon nitride layer on said pad oxide layer;
   (b) patterning said first silicon nitride layer to define an active region and a field region;
   (c) depositing a thin second silicon nitride layer followed by a thick oxide layer;
   (d) etching said thin second silicon nitride layer and said thick oxide layer to form spacers laterally bordering said field region comprising the remaining portions of said thin second silicon nitride layer and said thick oxide layer, and then ion implanting impurities into the field region;
   (e) removing said oxide spacers, and then growing a field oxide layer in the field region; and
   (f) removing said first silicon nitride layer, said nitride spacers, said polysilicon layer, and said pad oxide layer.

2. An isolation method in a semiconductor device as in claim 1, wherein said second silicon nitride layer has a thickness of 300 Å to 500 Å.

3. An isolation method in a semiconductor device as in claim 1, wherein said thick oxide layer has a thickness of 1000 Å to 3000 Å.

4. An isolation method in a semiconductor device as in claim 1, wherein said spacers are formed by an anisotropic etching of said oxide layer and second silicon nitride layer.

5. An isolation method in a semiconductor device as in claim 1, wherein said oxide spacers are removed by a wet etching method.

6. An isolation method in a semiconductor device comprising the sequentially performed steps of:
   (a) growing a pad oxide layer on a semiconductor substrate, and depositing a polysilicon layer and a first silicon nitride layer on said pad oxide layer;
   (b) patterning said first silicon nitride layer and a portion of said polysilicon layer to define an active region and a field region;
   (c) depositing a thin second silicon nitride layer followed by a thick oxide layer;
   (d) etching said thin second silicon nitride layer and said thick oxide layer to form spacers laterally bordering said field region comprising the remaining portions of said thin second silicon nitride layer and said thick oxide layer, and then ion implanting impurities into the field region;
   (e) removing said oxide spacers, and then growing a field oxide layer in the field region; and
   (f) removing said first silicon nitride layer, said nitride spacers, said polysilicon layer, and said pad oxide layer.

7. An isolation method in a semiconductor device as in claim 6, wherein said second silicon nitride layer has a thickness of 300 Å to 500 Å.

8. An isolation method in a semiconductor device as in claim 6, wherein said thick oxide layer has a thickness of 1000 Å to 3000 Å.

9. An isolation method in a semiconductor device as in claim 6, wherein said spacers are formed by an anisotropic etching of said oxide layer and said second silicon nitride layer.

10. An isolation method in a semiconductor device as in claim 6, wherein said oxide spacers are removed by a wet etching method.

* * * * *